(12) United States Patent
Cea et al.

(10) Patent No.: US 8,558,279 B2
(45) Date of Patent: Oct. 15, 2013

(54) NON-PLANAR DEVICE HAVING UNIAXIALLY STRAINED SEMICONDUCTOR BODY AND METHOD OF MAKING SAME

(75) Inventors: Stephen M. Cea, Hillsboro, OR (US); Roza Kotlyar, Portland, OR (US); Jack T. Kavalieros, Portland, OR (US); Martin D. Giles, Portland, OR (US); Tahir Ghani, Portland, OR (US); Kelin J. Kuhn, Aloha, OR (US); Markus Kuhn, Beaverton, OR (US); Nancy M. Zelick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 12/924,232

(22) Filed: Sep. 23, 2010

(65) Prior Publication Data

US 2012/0074464 A1    Mar. 29, 2012

(51) Int. Cl.
    *H01L 21/00*    (2006.01)

(52) U.S. Cl.
    USPC ............................ 257/190; 257/192; 257/255

(58) Field of Classification Search
    USPC ......................................... 257/190, 192, 255
    See application file for complete search history.

(56) References Cited

U.S. PATENT DOCUMENTS

| 6,960,781 B2* | 11/2005 | Currie et al. ..................... 257/19 |
| 7,427,779 B2 | 9/2008 | Damlencourt et al. |
| 7,504,704 B2* | 3/2009 | Currie et al. .................. 257/510 |
| 7,566,605 B2* | 7/2009 | Shifren et al. ................. 438/199 |
| 7,569,443 B2 | 8/2009 | Kavalieros et al. |
| 7,601,570 B2 | 10/2009 | Damlencourt |
| 7,851,291 B2* | 12/2010 | Shifren et al. ................. 438/199 |
| 8,008,751 B2* | 8/2011 | Irisawa et al. .................. 257/627 |
| 8,124,467 B2* | 2/2012 | Kronholz et al. ............. 438/197 |
| 8,169,025 B2* | 5/2012 | Bedell et al. ................... 257/351 |
| 8,211,772 B2* | 7/2012 | Kavalieros et al. ............ 438/285 |
| 8,247,275 B2* | 8/2012 | Hoentschel et al. .......... 438/150 |
| 8,313,999 B2* | 11/2012 | Cappellani et al. ............ 438/283 |
| 8,367,498 B2* | 2/2013 | Chang et al. ................... 438/268 |
| 8,445,892 B2* | 5/2013 | Cohen et al. ..................... 257/24 |
| 2004/0173812 A1* | 9/2004 | Currie et al. ..................... 257/103 |
| 2004/0262683 A1* | 12/2004 | Bohr et al. ...................... 257/338 |
| 2005/0095763 A1 | 5/2005 | Samavedam et al. |
| 2005/0205859 A1* | 9/2005 | Currie et al. ..................... 257/19 |
| 2007/0034945 A1* | 2/2007 | Bohr et al. ...................... 257/338 |
| 2007/0231983 A1* | 10/2007 | Shifren et al. ................. 438/197 |

(Continued)

OTHER PUBLICATIONS

Balakumar et al. "Effects of Annealing and Temperature on SGOI Fabrication Using Ge Condensation" Proceedings of 13th International Symposium on the Physical and Failure Analysis of Integrated Circuits, 2006, Singapore, pp. 150-153. Abstract only.

(Continued)

*Primary Examiner* — Laura Menz
(74) *Attorney, Agent, or Firm* — Trop, Pruner & Hu, P.C.

(57) ABSTRACT

A method and a device made according to the method. The method comprises providing a substrate including a first material, and providing a fin including a second material, the fin being disposed on the substrate and having a device active portion, the first material and the second material presenting a lattice mismatch between respective crystalline structures thereof. Providing the fin includes providing a biaxially strained film including the second material on the substrate; and removing parts of the biaxially strained film to form a substantially uniaxially strained fin therefrom.

20 Claims, 6 Drawing Sheets

(56) References Cited

U.S. PATENT DOCUMENTS

| | | |
|---|---|---|
| 2008/0157130 A1 | 7/2008 | Chang |
| 2009/0152589 A1* | 6/2009 | Rakshit et al. ............... 257/190 |
| 2009/0173967 A1* | 7/2009 | Hamaguchi et al. .......... 257/190 |
| 2009/0189199 A1* | 7/2009 | Moriyama et al. ............ 257/255 |
| 2009/0230480 A1* | 9/2009 | Shifren et al. ................ 257/369 |
| 2010/0244107 A1* | 9/2010 | Kronholz et al. ............. 257/288 |
| 2011/0101456 A1* | 5/2011 | Hoentschel et al. .......... 257/347 |
| 2011/0147805 A1* | 6/2011 | Irisawa et al. ................. 257/255 |
| 2011/0147811 A1* | 6/2011 | Kavalieros et al. ........... 257/288 |
| 2011/0147840 A1* | 6/2011 | Cea et al. ...................... 257/347 |
| 2011/0175166 A1* | 7/2011 | Bedell et al. .................. 257/351 |
| 2012/0025312 A1* | 2/2012 | Scheiper et al. .............. 257/347 |
| 2012/0074386 A1* | 3/2012 | Rachmady et al. ............. 257/24 |
| 2012/0074464 A1* | 3/2012 | Cea et al. ...................... 257/190 |
| 2012/0138886 A1* | 6/2012 | Kuhn et al. ........................ 257/9 |
| 2012/0241818 A1* | 9/2012 | Kavalieros et al. ............ 257/192 |

OTHER PUBLICATIONS

Du, "Study of Si1-xGex Junction Formation for SOI Based CMOS Technology", North Carolina State University,2008, Publication No. AAI3345359, Electrical Engineering, Dec. 2007, 119 pgs. Abstract only.

Balakumar et al."Fabrication of high Ge Content SiGe layer on Si by Ge condensation technique", Proceedings of 13th International Symposium on the Physical and Failure Analysis of Integrated Circuits, 2006, Singapore,pp. 301-305. Abstract only.

Zangenberg et al. "Ge Self-Diffusion in Epitaxial Si1-xGex Layers", The American Physical Society, Physical Review Letters, vol. 87, No. 12, Sep. 17, 2001, pp. 125901-1-125901-4. Abstract only.

Balakumar et al. "Germanium-Rich SiGe Nanowires Formed Through Oxidation of Patterned SiGe FINs on Insulator", journal of Electronic Materials, Regular Issue Paper, vol. 38, No. 3, Jan. 9, 2009, pp. 443-448.

Shimura et al. "Self-limiting oxidation of SiGe alloy on silicon-on-insulator wafers" Applied Physics letters 89, American Institute of Physics, 2006, pp. 111923-1-111923-3. Abstract only.

Balakumar et al. "SiGe amorphization during Ge condensation in silicon germanium on insulator", Applied Physics letters 89, American Institute of Physics, 2006, pp. 042115-1-042115-3. Abstract only.

Balakumar et al. SiGeO layer formation mechanism at the SiGe/oxide interfaces during Ge condensation, Applied Physics letters 90, American Institute of Physics, 2007, pp. 032111-1-032111-3. Abstract only.

* cited by examiner

NON-PLANAR DEVICE HAVING UNIAXIALLY STRAINED SEMICONDUCTOR BODY AND METHOD OF MAKING SAME

BACKGROUND

Microelectronic integrated circuits, such as microprocessors, comprise literally hundreds of millions of transistors. The speed of the integrated circuits is primarily dependent on the performance of these transistors. Thus, the industry has developed unique structures, such as non-planar transistors, and the use of straining techniques on components within the transistors to improve performance.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
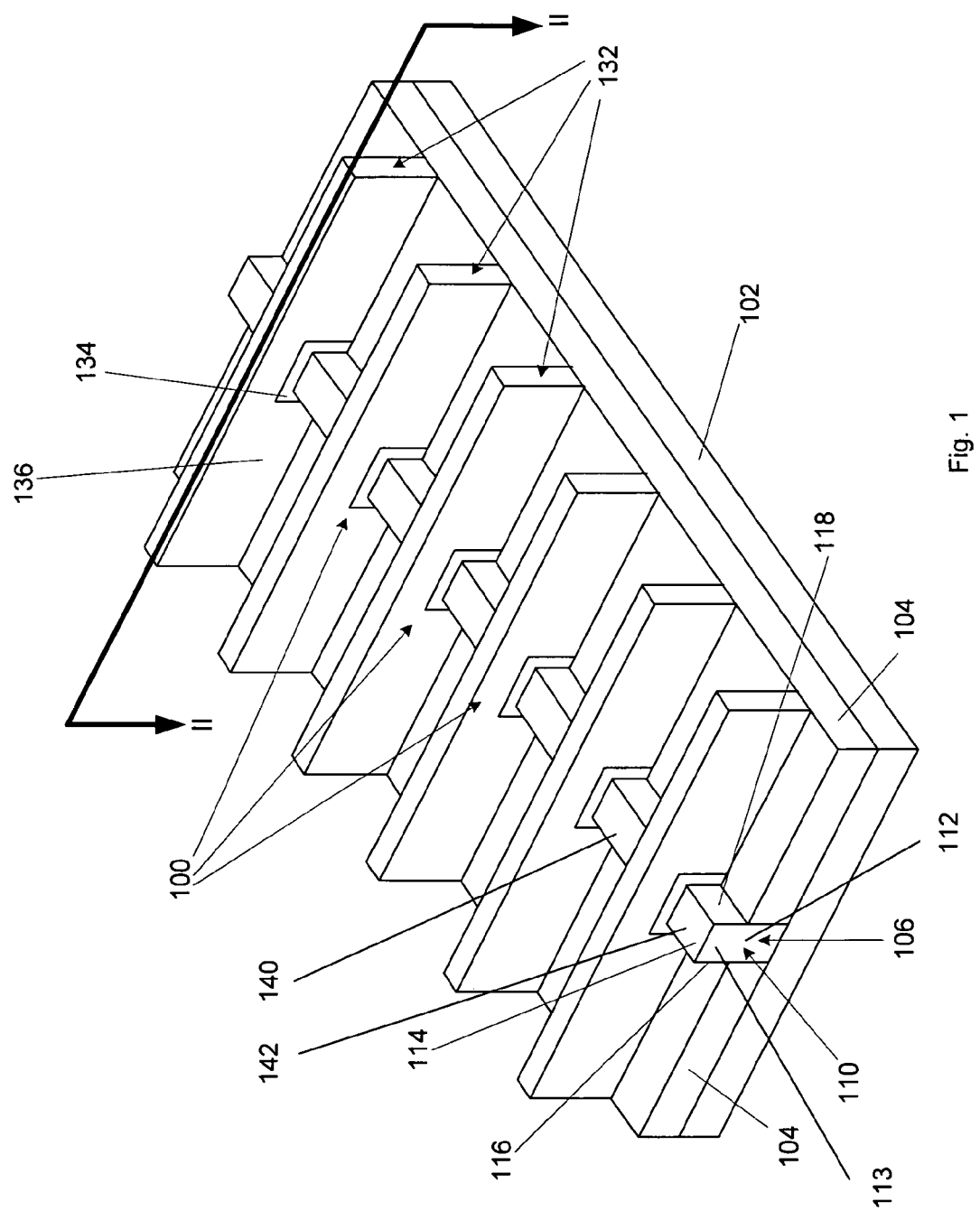
FIG. 1 is a perspective view of a plurality of non-planar devices according to one embodiment.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the fabrication of microelectronic devices. In at least one embodiment, the present subject matter relates to forming isolation structures in semiconductor bodies of non-planar transistors.

In the fabrication of non-planar transistors, such as tri-gate transistors, FinFETs, omega-FETs, and double-gate transistors, non-planar semiconductor bodies may be used to form transistors capable of full depletion with very small gate lengths (e.g., less than about 30 nm). For example in a tri-gate transistor, the semiconductor bodies generally have a fin-shape with a top surface and two opposing sidewalls formed on a bulk semiconductor substrate or a silicon-on-insulator substrate. A gate dielectric may be formed on the top surface and sidewalls of the fin and a gate electrode may be formed over the gate dielectric on the top surface of the fin and adjacent to the gate dielectric on the sidewalls of the fin. Thus, since the gate dielectric and the gate electrode are adjacent to three surfaces of the fin, three separate channels and gates are formed. As there are three separate channels formed, the fin can be fully depleted when the transistor is turned on.

Semiconductor bodies are generally formed of silicon-containing materials, and, as will be understood to those skilled in the art, inducing strain in silicon-containing materials can enhance channel mobility. An increase in channel mobility can result in advantages, including but not limited to, reduced electrical resistance, improved efficiency, increased current, and increased speed. Strain may be induced on a fin by materials that have lattice mismatch (e.g. a different lattice constant or size) in their crystalline structures. For example, when silicon and a silicon alloy including a strain inducing element therein, such as, for example germanium (where the alloy includes silicon germanium), are used to the form the substrate and the fin, respectively, the difference in lattice parameter between the silicon and the silicon alloy can cause the silicon alloy to be strained. Epitaxially grown strained silicon germanium is one example of a strained film grown on a silicon substrate. A silicon germanium film may otherwise be provided according to any one of well known methods, such as, for example, CVD, PVD, MBE, or any other suitable thin film deposition process.

Embodiments encompass an alloy of any strain inducing element with a semiconductor material that may result in a lattice mismatch with the material of the substrate. Thus, a strain inducing "element" as noted herein is not necessarily limited to a pure element from the periodic table of elements, but could include any material that, when alloyed with a semiconductor material, causes the lattice mismatch as noted above. For example, where the substrate is made of silicon, carbon and silicon may be used together to form a SiC alloy that would result in a tensile strain in the fin by virtue of a lattice mismatch with the silicon substrate, versus a compressive strain brought about by silicon germanium. SiC may for example be provided on the substrate according to the same methods as described in the paragraph above for silicon germanium. Other examples of strain inducing elements according to embodiments may include phosphorus, boron, nitrogen or tin.

FIG. 1 is a perspective view of a number of transistors 100 according to one embodiment, the transistors including a number gates formed on a strained fin, which is formed on a substrate. In an embodiment of the present disclosure, the substrate 102 may be a monocrystalline silicon substrate or a silicon-on-insulator substrate having are a pair of spaced apart isolation regions 104, such as shallow trench isolation (STI) regions, which define the substrate active region 106 therebetween. The substrate 102, however, need not necessarily be a silicon monocrystalline substrate and can be other types of substrates, as long as the substrate material and fin material are chosen to result in a uniaxial strain configuration according to embodiments. The substrate material may comprise, for example, germanium, gallium arsenide, indium antimonide, lead telluride, indium arsenide, indium phosphide, gallium arsenide, gallium antimonide, and the like, any of which may be combined with silicon. The isolations regions 104 may be be formed by forming trenches in the substrate 102 filling the trenches with an electrically insulative material, such as a silicon oxide, including, for example, $SiO_2$.

Each transistor 100, shown as tri-gate transistors, includes a semiconductor body 110 defining a fin 112, the semiconductor body 110 being formed adjacent the substrate active region 106. The fin 112 includes a device active portion 113 which extends above a surface of isolation regions 104. Device active portion 113 may have a top surface 114 and a pair of laterally opposite sidewalls, sidewall 116 and opposing sidewall 118. Semiconductor body 110 may be formed from a material, such as a single crystalline semiconductor having a different lattice constant or size than the bulk semiconductor substrate 102 so that semiconductor body 110 has a strain induced therein. In one embodiment of the present disclosure, the semiconductor substrate 102 is a monocrystalline silicon substrate and the semiconductor body 110 is a single crystalline silicon germanium alloy.

As further shown in FIG. 1, at least one gate 132 may be formed over the fin 112. To form a trigate device, a gate 132 may be fabricated by forming a gate dielectric layer 134 on or adjacent to the top surface 114 and on or adjacent to the pair of laterally opposing sidewalls 116, 118 of the device active portion 113, and forming a gate electrode 136 on or adjacent the gate dielectric layer 134. For a double-gate device (not shown), the gate dielectric layer would be formed on or adjacent to the pair of laterally opposing sidewalls 116 and 118 of device active portion 113, while top surface 114 would be covered by a gate isolation layer, as would be recognized by one skilled in the art.

The gate dielectric layer 134 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 134 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

As shown in FIG. 1, the gate electrode 136 may be formed on or adjacent to the gate dielectric layer 134. The gate electrode 136 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

The "width" of each tri-gate transistor in FIG. 1 is equal to the height of device active portion 113 at the sidewall 116, plus the width of device active portion 113 at the top surface 114, plus the height of device active portion 113 at the opposing sidewall 118. In an implementation of the present disclosure, the fin 112 runs in a direction substantially perpendicular to the gates 132. For a double-gate transistor (not shown), the "width" of a transistor would be equal to the sum of the height of the device active portion at each sidewall.

The gate electrode 136 can be formed of any suitable gate electrode material. In an embodiment of the present disclosure, the gate electrode 136 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 136 can be formed by well-known techniques, such as by blanket depositing a gate electrode material and then patterning the gate electrode material with well-known photolithography and etching techniques, as will be understood to those skilled in the art.

Referring still to FIG. 1, a source region 140 and a drain region 142 may be formed in the device active portion 113 of fin on opposite sides of the gate electrode 136. The source and drain regions may be formed of the same conductivity type, such as N-type or P-type conductivity. The source and drain regions may have a uniform doping concentration or may include sub-regions of different concentrations or doping profiles such as tip regions (e.g., source/drain extensions). In some implementations of an embodiment of the present disclosure, the source and drain regions may have substantially the same doping concentration and profile while in other implementations they may vary. According to one embodiment the fin may include a material at the source region and the drain region that presents a lattice mismatch between its crystal structure and the crystal structure of the substrate material, which mismatch is greater than a lattice mismatch between the crystalline structure of non-source-drain regions of the fin and the crystal structure of the substrate material. In this way, the source and drain regions may present regions of higher strain in the fin as compared with other regions of the fin. The higher lattice mismatch of the source and drain regions can be used to increase the strain in the channel, which would further improve channel mobility.

The greater lattice mismatch described above may be achieved in a number of different ways. For example according to one embodiment, recessed regions may be defined in the fin at locations where source and drain regions are to be provided. For example, the fin may be subjected to etching techniques to provide recessed therein as would be recognized by one skilled in the art. The etch of the source drain recesses may be effected for example in a self-aligned manner by aligning the source/drain recess etch to the gate electrode stack and spacers of the multi-gate device. Thereafter, the material for the source and drain regions may be epitaxially re-grown into the recesses. The material for the source and drain regions may for example include a doped material and/or a material including the same percentage of the strain inducing element as that present in the rest of the fin. For example, where the fin material includes a silicon germanium alloy, the source and drain recesses may be refilled with a doped silicon germanium alloy and/or with a silicon germanium alloy having the same percentage of germanium as present in the rest of the fin. The silicon germanium could for example be doped with boron or with any other similar dopant as would be recognized by one skilled in the art. Where the fin material includes SiC, a dopant choice could include, for example, phosphorus, as would be recognized by one skilled in the art.

According to another embodiment, more of the strain inducing element may be implanted into the material of the fin by way of ion doping in order to impart further strain to the fin at the source and drain regions, thus avoiding a need to provide recesses in the source and drain regions. In such an instance, the source and drain regions would exhibit higher doping levels than other regions of the fin. For example, the dopant could include boron or any other similar dopant as would be recognized by one skilled in the art. Examples of dopants according to embodiments could include germanium to increase strain, or boron to improve resistance, other dopants being within the purview of embodiments.

Figure 2A:
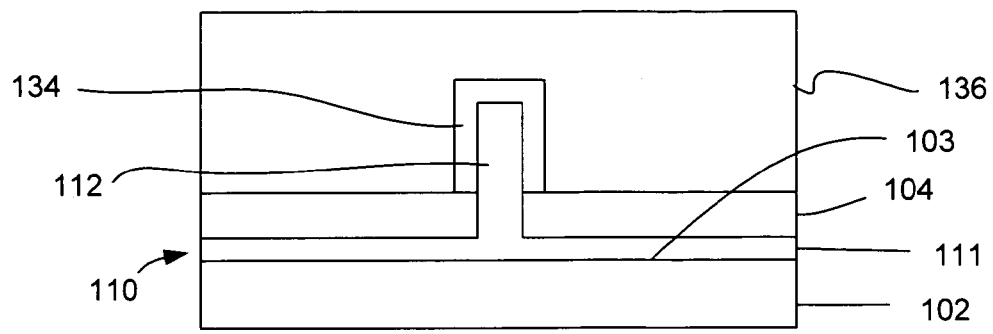
FIGS. 2a-2c are cross-sectional views of transistors according to three respective embodiments.
Figure 2B:
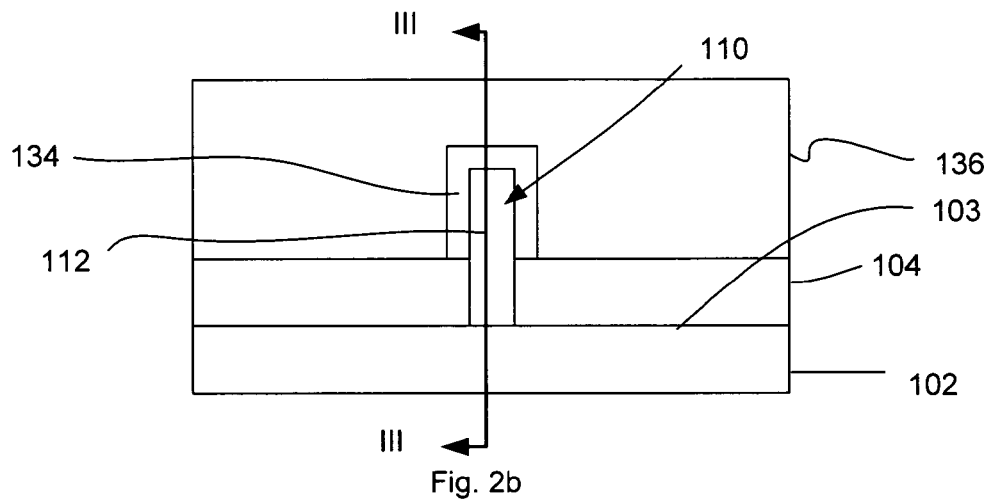
Figure 2C:
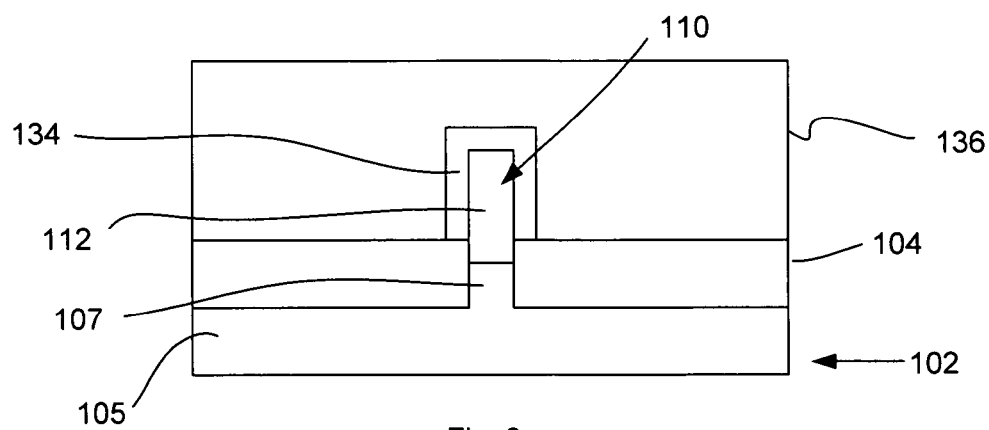

Referring next to FIGS. 2a-2c, transistor cross-sections are shown according to three embodiments. FIG. 2a shows the semiconductor body 110 as having a base portion 111 and a fin 112 where the base portion 110 is disposed between substrate 102 and isolation regions 104, and where the substrate has a substantially planar upper surface 103. However, embodiments are not so limited. For example, as shown in FIGS. 2b and 2c, respectively, the semiconductor body 110 could consist of a fin 112 without a base portion extending above the substrate 102 (as also shown in FIG. 1, FIG. 2b being a cross section of FIG. 1 along lines II-II). According to one embodiment, the substrate 102 could have a substantially planar upper surface 103 as shown in FIG. 2b, or, in the alternative, the substrate 102 could include a substrate base portion 105 and a substrate fin 107 extending from the substrate base portion 105, fin 112 of semiconductor body 110 extending above the substrate fin 107.

Figure 3:
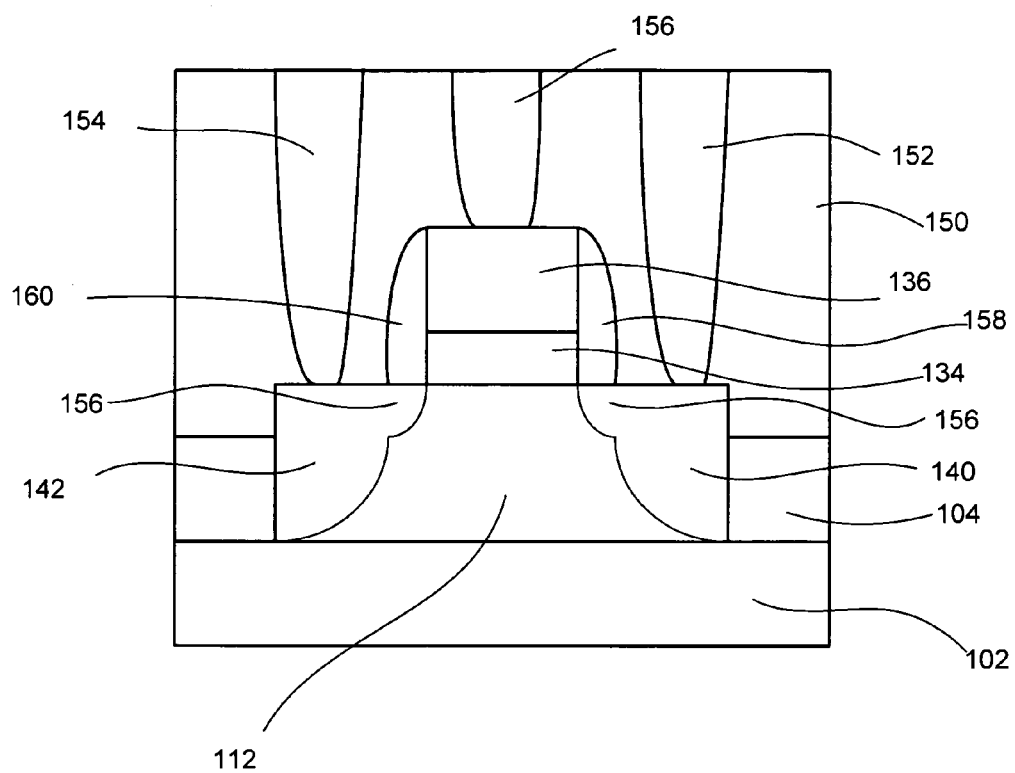
FIG. 3 is a cross-sectional view of one embodiments showing tip and source/drain regions.

Referring next to FIG. 3, a cross section is shown along lines III-III of FIG. 2b, additionally showing a first ILD (inter-layer dielectric) layer 150, source and drain contacts 152 and 154, and gate contact 156. Source region 140 and drain region 142 are also shown, although their positions as shown could of course be switched. In the shown embodiments, tip regions 158 and 160 and spacers 162 and 164 are also shown. The tip regions could, according to some embodiments, be provided as described above with respect to the source region 140 and drain region 142. The spacers may be provided in a well known manner as would be recognized by one skilled in the art. In this way, a device according to embodiments could be incorporated as part of an integrated circuit in a well known manner. The device could for example be a PMOS device.

Figure 4:
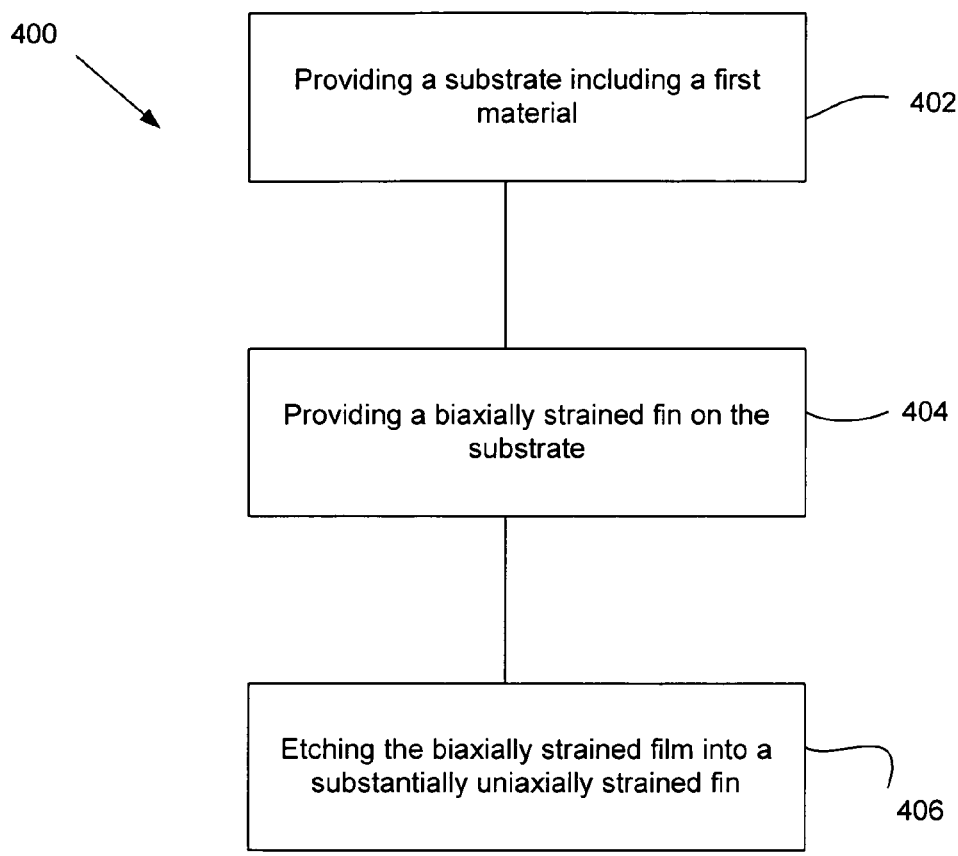
FIG. 4 is a flowchart depicting a method embodiment.
Figure 5A:
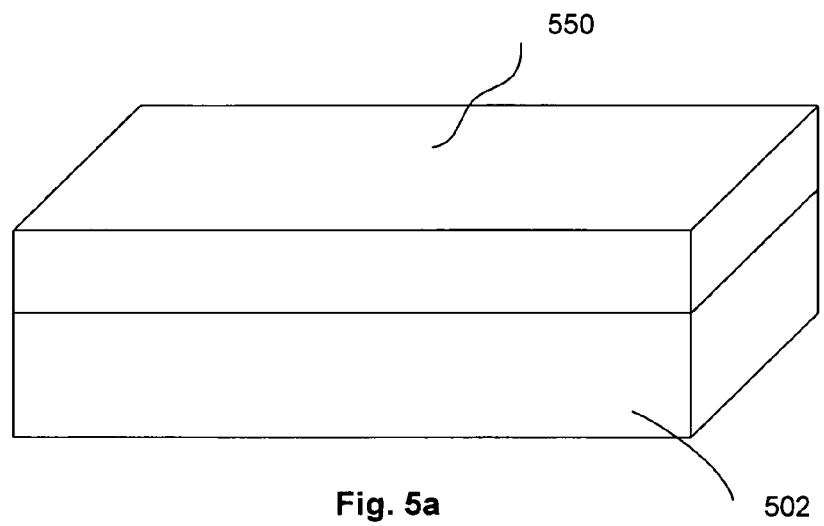
FIGS. 5a and 5b show perspective views of an assembly including a substrate and a strained film thereon.
Figure 5B:
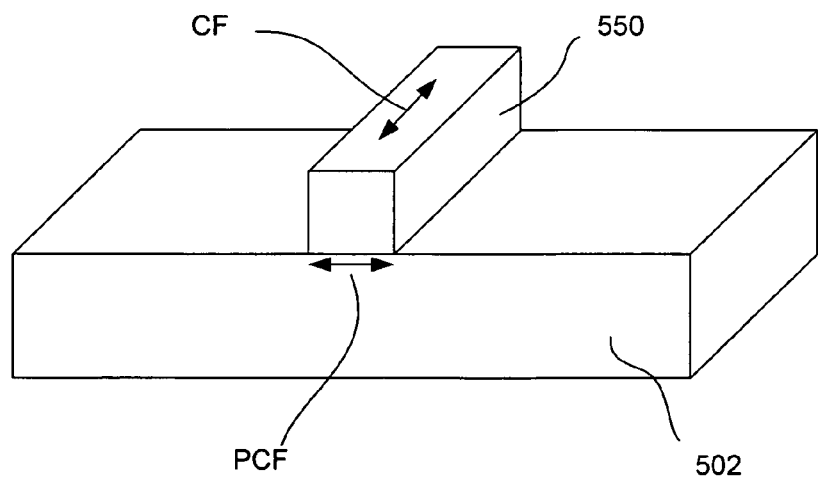

Referring next to FIGS. 4, 5a and 5b, a method of making a device according to an embodiment will be described. A method embodiment involves the provision of an already strained film which then serves as a basis for forming a strained fin therefrom, such as for example by way of etching, although other ways of providing the fin from a strained film are within the purview of embodiments.

As seen in FIG. 4, a method embodiment at block 400 includes providing a substrate including a first material, such as silicon. At block 402, a substrate may be provided including a first material. At block 404, a biaxially strained film may be provided on the substrate, and at block 406, a uniaxially fin may be formed from the biaxially strained film by etching the same.

Referring more particularly to FIGS. 5a and 5b, an exemplary method embodiment will be described below.

Referring first to FIG. 5a, a silicon substrate 502 may first be provided, and a biaxially strained SiGe film 550 grown thereon. As noted above, the SiGe film may be provided using CVD, PVD, MBE, or any other suitable thin film deposition process. A thickness of the SiGe film 550 may be from, for example, from about 25 nm to about 40 nm. Thicker SiGe films and/or a higher germanium percentage in the SiGe in general could cause undesirable dislocations within the crystal that could result in less strain in the fin, while thinner SiGe could have the reverse effect. In general, care could be taken to avoid dislocations while not unduly limiting a thickness of the SiGe film.

As seen in FIG. 5b, the SiGe film 550 may be subjected to photolithography and etching in order to result in a fin 512 as shown. Preferably, a dry etch may be used in order to provide the fin, in a conventional manner, such as for example used in the provision of shallow trench isolation regions. An etch of the SiGe film 550 according to the shown embodiments results in a preservation of the stress in the direction CF of current flow (i.e. in a longitudinal direction of the fin) while substantially relaxing a stress in a direction perpendicular to the current flow, such as direction PCF shown in FIG. 5b.

The percentage of the strain inducing element may be chosen to optimize transistor performance, as will be understood to those skilled in the art. For example, where the strain inducing element comprises germanium, the material of the fin may between about 30% and about 70% germanium, and preferably between about 40% to about 50% germanium. Optionally, the material of the fin may have a constant percentage of the strain inducing element throughout a volume thereof extending between substrate and the gate dielectric. For example, referring to FIGS. 2a-2c, a portion 115 of the fin disposed between substrate 102 and the gate dielectric 134 (i.e. the portion defining channel 135 as shown in FIGS. 1, and 2a-2c) may present a constant percentage of germanium throughout a volume thereof. In addition, this constant percentage may apply throughout an entire volume of the fin.

Referring to Table 1 below, a comparison is provided of measured and simulated strain averages before and after etching of SiGe film containing 40% germanium.

TABLE 1

|  | Average of average biaxial strain measured by Raman | Average of average biaxial strain in SiGe from Simulation |
|---|---|---|
| Before etching | −1.60% | −1.55% |
| After etching | −0.85% | −0.80% |

The measured averages of averages were obtained by using actual and simulated Raman spectroscopy for a SiGe film. The averages of averages were obtained by using Raman spectroscopy measurements and Finite element based stress simulations for a SiGe film. As suggested in the first column of Table 1, the strain in the SiGe film is less after etching than before etching. The second column of Table 1, relating to simulated data for a biaxially strained SiGe film, strongly correlates with the values in column one, and suggests that that the biaxial strain is relaxed to uniaxial post etching.

Figure 6A:
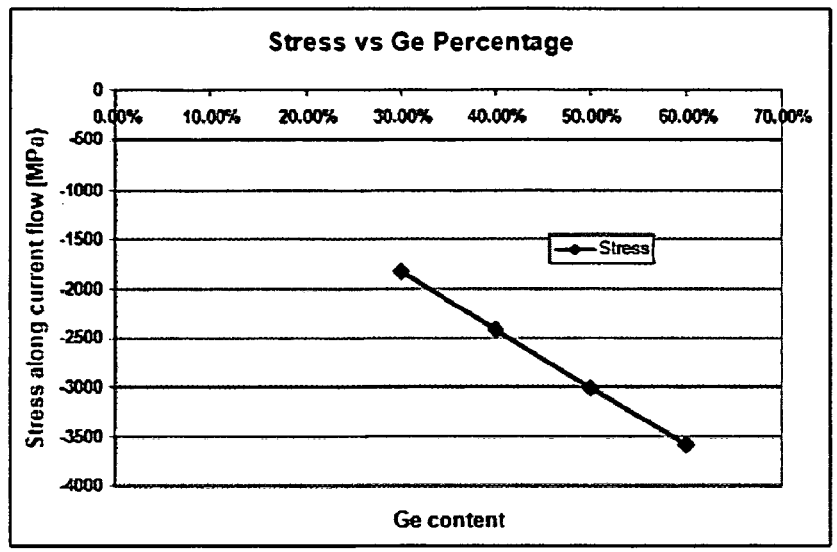
FIG. 6a is a graph plotting simulated average stress in the channel along the direction of current flow versus the percentage of Ge in a SiGe fin according to one example.

Referring next to FIG. 6a, a graph is provided plotting simulated average stress in the channel along the direction of current flow versus the percentage of Ge in a SiGe fin. As can be clearly seen in FIG. 6a, the stress in the fin along the direction of current flow increases with increasing percentages of Ge in the SiGe fin material. Therefore, according to some embodiments, different desired stresses can be obtained by increasing the percentage of Ge in the film, or by reducing a width of the SiGe film, or both. For example, one way to increase the percentage of Ge in a SiGe film such as SiGe film 550 of FIG. 5a would be to reduce a width of the film using oxidation. In this way, the oxygen in an oxide, such as, for example, silicon dioxide, would combine with some of the silicon in the SiGe film consuming the same and leaving a higher concentration of Ge in the SiGe left behind, and further leaving a thinner SiGe film behind than before oxidation, in this way resulting in further strain in the fin.

Figure 6B:
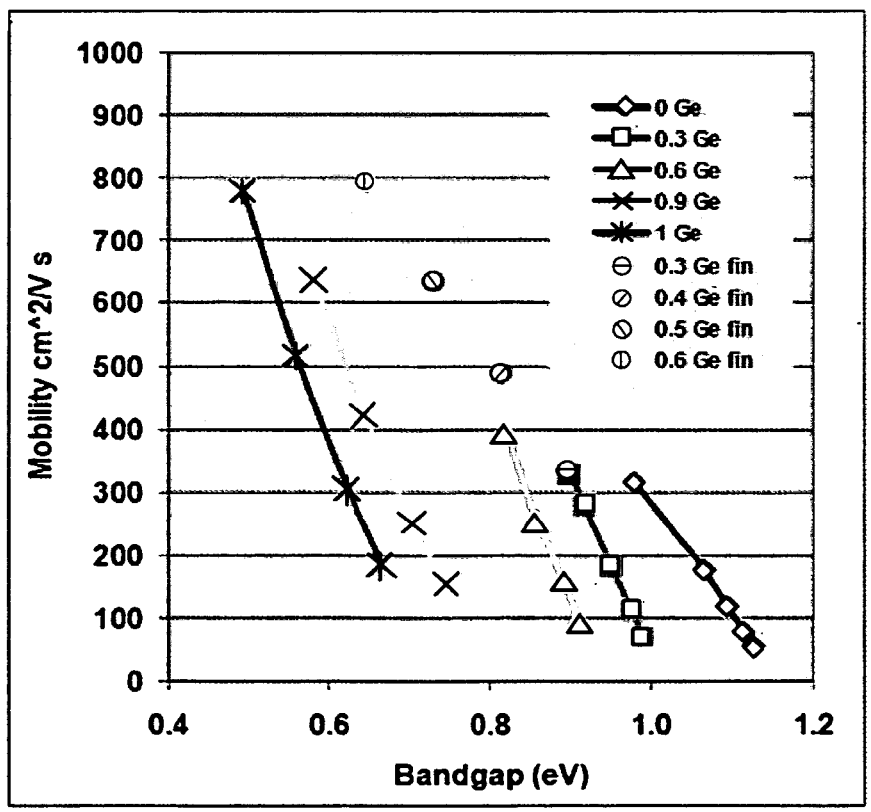
FIG. 6b is a graph plotting mobility versus bandgap for SiGe films having different percentages and therefore different uniaxial stress levels according to another example.

Referring next to FIG. 6b, a graph is provided plotting mobility versus bandgap for SiGe films having different percentages and therefore different uniaxial stress levels. The circles show the resultant uniaxial stress for the different percentage films post-etching. The graph shows that a variety of different mobilities and bandgap may be achieved by engineering the stress and Ge percentage of the provided SiGe film. For example, adding a predetermined percentage of germanium to the source and drain regions and/or using other straining techniques such as gate strain, nitride capping layers, etc, can be used to modify the stress of the channel for a given SiGe fin having an initial germanium percentage.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A device, comprising:
    a substrate including a first material;
    a uniaxially strained fin including a second material, the fin being disposed on the substrate and having a device active portion;
    wherein the first material and the second material present a lattice mismatch between respective crystalline structures thereof;
    wherein a source region and a drain region, both included in the fin and both including the second material, have greater lattice mismatch with the first material than other regions of the fin.

2. The device of claim 1, further comprising:
    a gate dielectric on the device active portion;
    a gate electrode on the gate dielectric.

3. The device of claim 1, wherein the first material comprises silicon, and the second material comprises an alloy including silicon and a strain inducing element.

4. The device of claim 3, wherein the strain inducing element comprises germanium and the second material comprises silicon germanium.

5. The device of claim 4, wherein the second material comprises between 30% to 70% germanium.

6. The device of claim 3, wherein the second material has a substantially constant percentage of the strain inducing element to silicon throughout an entire volume thereof.

7. The device of claim 2, further comprising:
    the device active portion includes:
        the source region adjacent one side of the gate electrode;
        the drain region adjacent another side of the gate electrode opposite the one side;
        wherein the fin includes a third material at each of the source region and the drain region, the third material presenting a lattice mismatch between a crystalline structure thereof and the crystalline structure of the first material which is greater than the lattice mismatch between respective crystalline structures of the second material and of the first material.

8. The device of claim 7, wherein:
    the first material comprises silicon;
    the second material comprises an alloy of silicon and a strain inducing element; and
    the second material at the source region and at the drain region contains a higher percentage of the strain inducing element than at other regions of the device active portion.

9. The device of claim 8, wherein the source region and the drain region comprise recessed regions.

10. The device of claim 8, wherein the source region and the drain region comprise respective regions implanted with Ge ions.

11. A method of making a device comprising:
    providing a substrate including a first material;
    providing a fin including a second material, the fin being disposed on the substrate and having a device active portion, the first material and the second material presenting a lattice mismatch between respective crystalline structures thereof, wherein providing the fin includes:
        providing a biaxially strained film including the second material on the substrate; and
        removing parts of the biaxially strained film to form a substantially uniaxially strained fin therefrom;
    wherein a source region and a drain region, included in the fin and including the second material, have greater lattice mismatch with the first material than other regions of the fin.

12. The method of claim 11, further comprising:
    providing a gate dielectric on the device active portion; and
    providing a gate electrode on the gate dielectric.

13. The method of claim 11, wherein removing includes etching the biaxially strained film into a substantially uniaxially strained fin.

14. The method of claim 11, wherein the first material comprises silicon, and the second material comprises an alloy including silicon and a strain inducing element.

15. The method of claim 14, wherein the strain inducing element comprises germanium and the second material comprises silicon germanium.

16. The method of claim 15, wherein the second material comprises between 30% to 70% germanium.

17. The method of claim 12, further comprising:
    providing the source region in the device active portion adjacent one side of the gate electrode;
    providing the drain region in the device active portion adjacent another side of the gate electrode opposite the one side;
    wherein the fin includes a third material at each of the source region and the drain region, the third material presenting a lattice mismatch between a crystalline structure thereof and the crystalline structure of the first material which is greater than the lattice mismatch between respective crystalline structures of the second material and of the first material.

18. The method of claim 17, wherein:
the first material comprises silicon;
the second material comprises an alloy of silicon and a strain inducing element; and
the second material at the source region and at the drain region contains a higher percentage of the strain inducing element than at other regions of the fin.

19. The method of claim 17, wherein providing the source region and providing the drain region each include implanting the strain inducing element by way of ion doping into the device active portion of the fin at respective ones of said one side and of said another side of the gate electrode such that the source region and the drain region include a higher percentage of the strain inducing element than other regions of the device active portion.

20. The method of claim 17, wherein providing the source region and providing the drain region each include:
recessing the device active portion at said one side and at said another side of the gate electrode to define respective recesses; and
providing the source region and the drain region within the respective recesses such that the source region and the drain region include a higher percentage of the strain inducing element than other regions of the device active portion.

* * * * *